(12) United States Patent
Geen

(10) Patent No.: US 6,767,758 B1
(45) Date of Patent: Jul. 27, 2004

(54) MICRO-MACHINED DEVICE STRUCTURES HAVING ON AND OFF-AXIS ORIENTATIONS

(75) Inventor: John A. Geen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/463,652

(22) Filed: Jun. 17, 2003

Related U.S. Application Data

(60) Provisional application No. 60/466,082, filed on Apr. 28, 2003.

(51) Int. Cl.$^7$ .............................................. H01L 21/00
(52) U.S. Cl. .............................. 438/48; 438/52; 438/53
(58) Field of Search ..................................... 438/48–61

(56) References Cited

U.S. PATENT DOCUMENTS

| | | | |
|---|---|---|---|
| 4,715,227 A | 12/1987 | Pittman | 73/504 |
| 4,744,248 A | 5/1988 | Stewart | 73/505 |
| 4,744,249 A | 5/1988 | Stewart | 73/505 |
| 4,841,773 A | 6/1989 | Stewart | 73/510 |
| 5,007,279 A | 4/1991 | Miall | 72/394 |
| 5,313,835 A | 5/1994 | Dunn | 73/505 |
| 5,392,650 A | 2/1995 | O'Brien et al. | 73/517 |
| 5,590,460 A | 1/1997 | DiStefano et al. | 29/830 |
| 5,712,426 A | 1/1998 | Sapuppo et al. | 73/504.03 |
| 5,869,760 A | 2/1999 | Geen | 73/504.12 |
| 6,225,138 B1 * | 5/2001 | Silverbrook | 438/21 |
| 6,305,222 B1 | 10/2001 | Johnson et al. | 73/504.12 |
| 6,308,569 B1 | 10/2001 | Stewart | 73/514.32 |
| 6,508,122 B1 | 1/2003 | McCall et al. | 73/504.12 |

\* cited by examiner

*Primary Examiner*—H. Jey Tsai
(74) *Attorney, Agent, or Firm*—Weingarten, Schurgin, Gagnebin & Lebovici LLP

(57) ABSTRACT

A micro-machined multi-sensor that provides 1-axis of acceleration sensing and 2-axes of angular rate sensing. A method of fabricating the micro-machined multi-sensor includes depositing a layer of sacrificial material or structural material onto the substrate surface. The deposited layer of sacrificial or structural material is then masked with a predetermined mask pattern formed using a rectilinear grid having multiple horizontal and vertical spacings. The mask pattern defines the functional components of the sensor device. In the event the multi-sensor includes at least one functional component whose alignment on the substrate is critical to the optimal performance of the sensor, the critical component is defined so that its longitudinal axis is substantially parallel to the horizontal or vertical axis of the mask. In the event the multi-sensor includes at least one functional component whose alignment on the substrate surface is not critical to optimal sensor performance, the non-critical component may be defined so that its longitudinal axis is not parallel to the horizontal and vertical axes of the mask.

12 Claims, 10 Drawing Sheets

MICRO-MACHINED DEVICE STRUCTURES HAVING ON AND OFF-AXIS ORIENTATIONS

CROSS REFERENCE TO RELATED APPLICATIONS

This application claims priority of U.S. Provisional Patent Application No. 60/466,082 filed Apr. 28, 2003 entitled MICRO-MACHINED DEVICE STRUCTURES HAVING ON AND OFF-AXIS ORIENTATIONS.

STATEMENT REGARDING FEDERALLY SPONSORED RESEARCH OR DEVELOPMENT

N/A

BACKGROUND OF THE INVENTION

The present invention relates generally to integrated angular rate and acceleration sensors ("multi-sensors"), and more specifically to a micro-machined multi-sensor capable of providing 1-axis of acceleration sensing and 2-axes of angular rate sensing, and a technique of fabricating such a multi-sensor.

Micro-machined multi-sensors are known that comprise at least one accelerometer for providing indications of acceleration sensing and angular rate sensing in a single sensor device. A conventional micro-machined multi-sensor, as described in U.S. Pat. No. 5,392,650 issued Feb. 28, 1995 entitled MICRO-MACHINED ACCELEROMETER GYROSCOPE, comprises a pair of accelerometers, in which each accelerometer includes a rigid accelerometer frame anchored to a substrate, and a proof mass suspended from the rigid frame by a plurality of flexures. The micro-machined multi-sensor typically has a single acceleration-sensing axis and a single rotation-sensing axis perpendicular to the acceleration axis associated therewith. Further, the micro-machined multi-sensor is typically configured for simultaneously vibrating the proof masses in antiphase along a vibration axis, which is perpendicular to the acceleration and rotation axes.

In the event the conventional micro-machined multi-sensor is subjected to linear and rotational motions while the proof masses are simultaneously vibrated in an antiphase manner, forces of linear and Coriolis acceleration are generated that deflect the proof masses relative to the substrate. The multi-sensor is configured to sense the deflections of the respective proof masses, and to produce corresponding acceleration sense signals having values proportional to the magnitude of the deflection. Because the responses of the vibrating proof masses to linear acceleration are in phase and the responses of the proof masses to Coriolis acceleration are in antiphase, the linear acceleration components (containing the acceleration sensing information) and the rotational acceleration components (containing the angular rate sensing information) of the sense signals can be separated by adding or subtracting the signals to cancel the rotational or linear components, respectively.

One drawback of the above-described conventional micro-machined multi-sensor is that it typically provides only 1-axis of acceleration sensing and only 1-axis of angular rate sensing. However, it is often advantageous to provide more than one axis of acceleration sensing and/or angular rate sensing in a single sensor device.

A second conventional micro-machined sensor capable of measuring rates of rotation relative to two rotation-sensing axes is described in U.S. Pat. No. 5,869,760 issued Feb. 9, 1999 entitled MICRO-MACHINED DEVICE WITH ROTATIONALLY VIBRATED MASSES. The micro-machined sensor comprises a pair of accelerometers, in which each accelerometer includes a mass in the form of a circular beam suspended over a substrate by a plurality of flexures, and an adjacent pair of acceleration-sensing electrodes. The two rotation-sensing axes associated with the micro-machine sensor are in the plane of the substrate. Further, the micro-machined sensor is configured for rotationally vibrating the circular beams in an antiphase manner, i.e., alternately rotating one circular beam clockwise/counterclockwise while the other beam simultaneously rotates in the opposite direction by substantially the same amount.

In the event the second conventional micro-machined sensor is subjected to linear and rotational motions while the circular beams are simultaneously rotated in antiphase, forces of linear and Coriolis acceleration are generated that deflect the beams relative to the substrate. The acceleration-sensing electrodes sense the deflections of the respective beams, and produce corresponding acceleration sense signals proportional to the magnitude of the deflection and the rate of rotation relative to the rotation-sensing axes. Because the sign of the rotational acceleration components (containing the angular rate sensing information) of the sense signals corresponds to the direction of rotation of the circular beams, the rotational components can be separated from the linear acceleration components of the sense signals by subtracting the signals to cancel the linear components. However, although the micro-machined sensor is capable of providing more than one axis of angular rate sensing, it has drawbacks in that it typically provides no acceleration sensing information.

Conventional techniques of fabricating micro-machined sensors and multi-sensors are known that employ layers of sacrificial and structural material in the fabrication process. One such fabrication technique is known as surface micro-machining, in which a micro-machined device is fabricated substantially onto the surface of a substrate. The conventional surface micro-machining technique includes depositing a layer of sacrificial material (e.g., silicon dioxide, $SiO_2$) or structural material (e.g., polysilicon) onto the surface of the substrate (e.g., silicon). The structural material is employed in the construction of functional components of the micro-machined device, and the sacrificial material is subsequently removed in a final step of the fabrication process. The deposited layer of sacrificial or structural material is masked with a mask pattern, which is typically transferred using a photolithographic process. Next, the underlying material not protected by the mask is etched to transfer the mask pattern to that particular material layer. The depositing, masking, and etching steps are then repeated until the construction of the functional components of the micro-machined device is completed. Finally, one or more portions of the structural material are released by etching or otherwise removing the underlying and/or surrounding sacrificial material. The conventional surface micro-machining fabrication technique is typically low-cost and generally permits electronic circuitry to be incorporated near the functional components of the micro-machined device.

However, the conventional surface micro-machining technique has drawbacks when employed in fabricating micro-machined sensors and multi-sensors. For example, a micro-machined multi-sensor typically includes at least one functional component whose alignment and/or width are critical to the optimal performance of the sensor device. Because the mask patterns used in the construction of the functional components of the sensor device are typically laid out according to the horizontal and vertical spacings of a rectilinear grid, it can be difficult to obtain such critical alignments and widths of the functional sensor components.

It would therefore be desirable to have a micro-machined multi-sensor device that provides both acceleration sensing and angular rate sensing, and avoids the drawbacks of the above-described conventional micro-machined sensor devices.

BRIEF SUMMARY OF THE INVENTION

In accordance with the present invention, a micro-machined multi-sensor is disclosed that provides 1-axis of acceleration sensing and 2-axes of angular rate sensing. The presently disclosed micro-machined multi-sensor comprises at least one pair of accelerometers, which provide electrically independent acceleration sense signals including information pertaining to acceleration sensing and angular rate sensing relative to one or more sensing axes.

In a first embodiment, the micro-machined multi-sensor comprises a pair of accelerometers, each accelerometer including a mass suspended over and anchored to a substrate by a plurality of flexures. The multi-sensor has two associated mutually orthogonal rotation-sensing axes in the plane of the substrate, and one associated acceleration-sensing axis perpendicular to the two rotation axes. Further, each mass has lateral and longitudinal axes of symmetry and a driven rotation axis perpendicular to the lateral and longitudinal axes associated therewith. Each accelerometer further includes a first pair of acceleration sense electrode structures disposed along the lateral axis, and a second pair of acceleration sense electrode structures disposed along the longitudinal axis of the respective masses. The multi-sensor further comprises a fork member configured to couple the two masses to allow relative antiphase movement and to resist in phase movement of the masses. The pluralities of flexures anchoring the masses to the substrate are configured to constrain the masses to move substantially only in a rotational manner relative to the substrate.

In the presently disclosed embodiment, the micro-machined multi-sensor comprises a drive electrode structure configured for rotationally vibrating the masses in antiphase, i.e., alternately rotating one mass clockwise/counterclockwise about its rotation axis, while the other mass simultaneously rotates about its rotation axis in the opposite direction by substantially the same amount. In the event the multi-sensor with the rotationally vibrating masses is subjected to linear and/or rotational motion, the first and second pairs of acceleration sense electrodes produce electrically independent acceleration sense signals based on forces of linear and Coriolis acceleration imposed on the masses. The multi-sensor is configured (1) to add the difference of the accelerations sensed by the first pair of acceleration sense electrodes of the first accelerometer, and the difference of the accelerations sensed by the first pair of acceleration sense electrodes of the second accelerometer, to obtain information pertaining to angular rate sensing relative to the lateral rotation axis of the multi-sensor, (2) to add the difference of the accelerations sensed by the second pair of acceleration sense electrodes of the first accelerometer, and the difference of the accelerations sensed by the second pair of acceleration sense electrodes of the second accelerometer, to obtain information pertaining to angular rate sensing relative to the longitudinal rotation axis of the multi-sensor, and (3) to add the sum of the accelerations sensed by the first pair of acceleration sense electrodes of the first accelerometer, the sum of accelerations sensed by the first pair of acceleration sense electrodes of the second accelerometer, the sum of accelerations sensed by the second pair of acceleration sense electrodes of the first accelerometer, and the sum of accelerations sensed by the second pair of acceleration sense electrodes of the second accelerometer, to obtain information pertaining to acceleration sensing relative to the acceleration axis of the multi-sensor.

In a second embodiment, the micro-machined multi-sensor comprises two pairs of accelerometers arranged to form a square. Each accelerometer includes a mass suspended over and anchored to a substrate. The multi-sensor further comprises respective fork members coupling adjacent pairs of masses to allow relative antiphase movement and to resist in phase movement of the adjacent masses. The micro-machined multi-sensor has two associated, mutually orthogonal rotation-sensing axes in the plane of the substrate, and one associated acceleration-sensing axis perpendicular to the two rotation axes. Each accelerometer further includes a first pair of acceleration sense electrode structures disposed along a lateral axis, and a second pair of acceleration sense electrode structures disposed along a longitudinal axis of the respective mass. The two pairs of accelerometers are arranged in mirror image fashion on opposite sides of the respective rotation axes. Because of the enhanced symmetry of this second embodiment of the micro-machined multi-sensor, the multi-sensor device can be more easily centered on a die, thereby reducing adverse effects of die surface area distortions and gradients.

In a third embodiment, a method of fabricating the micro-machined multi-sensor includes depositing a layer of sacrificial material or structural material onto the substrate surface. The structural material is employed in the construction of functional components of the sensor device, and the sacrificial material is subsequently removed in a final step of the fabrication method. The deposited layer of sacrificial or structural material is then masked with a predetermined mask pattern, which is formed using a rectilinear grid having multiple horizontal and vertical spacings. The mask pattern is employed to define the functional components of the sensor device. In the event the micro-machined multi-sensor includes at least one first functional component whose alignment and/or width are critical to the optimal performance of the sensor device, the first functional component is defined by the mask pattern so that its longitudinal axis is substantially parallel to the horizontal or vertical axis of the mask. In the event the micro-machined multi-sensor includes at least one second functional component whose alignment and/or width are not critical to optimal sensor performance, the second functional component may be defined by the mask pattern so that its longitudinal axis is not parallel to the horizontal and vertical axes of the mask.

By configuring the above-described micro-machined multi-sensors to include at least one pair of accelerometers, each accelerometer having a mass and providing two pairs of electrically independent acceleration sense signals along lateral and longitudinal axes of symmetry of the mass, respectively, 1-axis of acceleration sensing and 2-axes of angular rate sensing can be obtained by suitably adding and/or subtracting the acceleration sense signals. Further, by defining functional components of the sensor device with at least one mask so that components having critical alignments and/or physical dimensions are disposed substantially parallel to the horizontal or vertical axis of the mask, and non-critical components may be oriented off the mask axes, improved sensor performance can be achieved.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

U.S. Provisional Patent Application No. 60/466,082 filed Apr. 28, 2003 entitled MICRO-MACHINED DEVICE STRUCTURES HAVING ON AND OFF-AXIS ORIENTATIONS is incorporated herein by reference.

A micro-machined multi-sensor is disclosed that provides 1-axis of acceleration sensing and 2-axes of angular rate sensing in a single sensor device. The presently disclosed multi-sensor can be symmetrically laid out on a die, thereby improving yield as well as improving the overall performance of the multi-sensor device.

Figure 1:
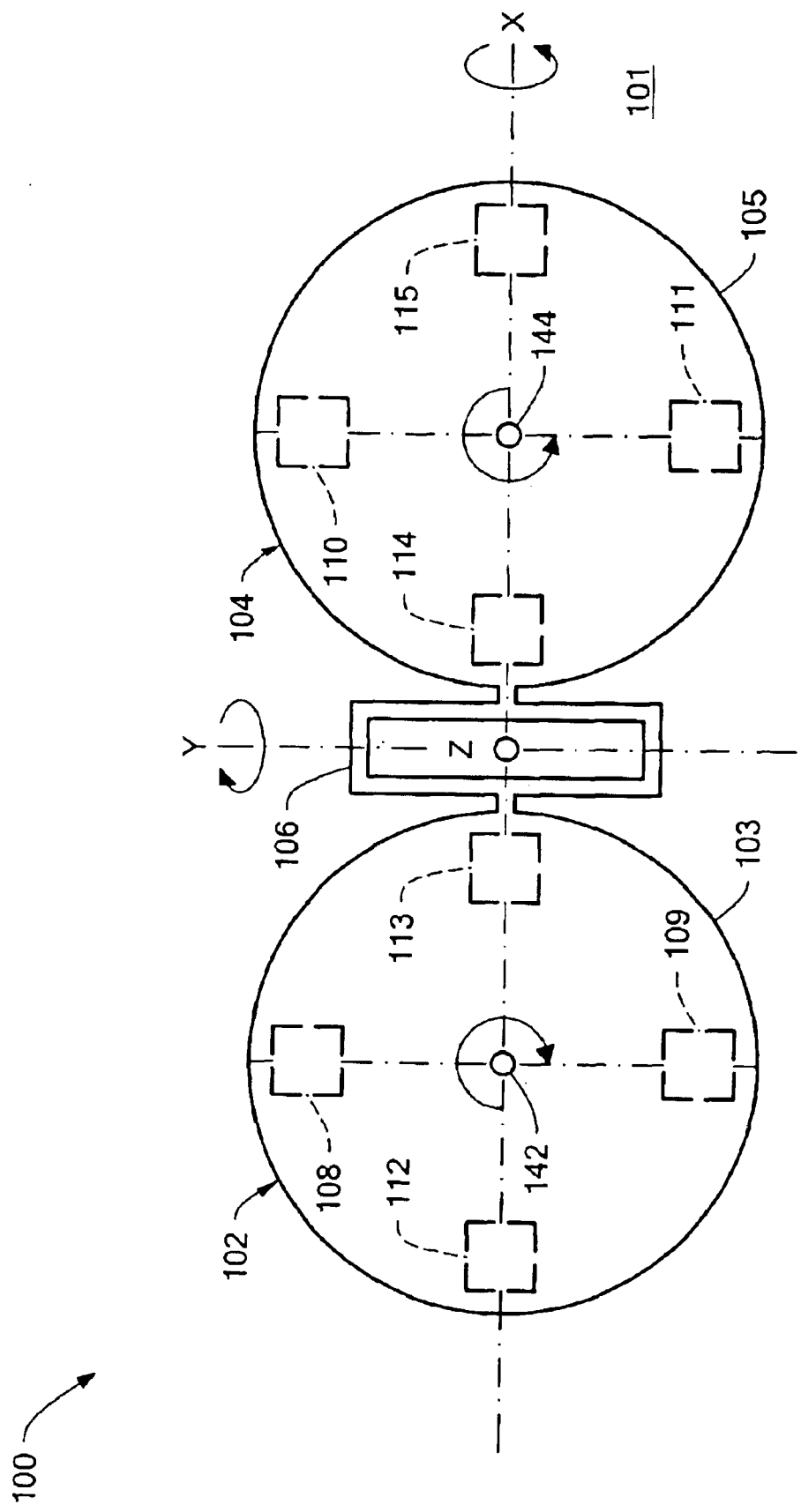
FIG. 1 is a simplified block diagram of a micro-machined multi-sensor according to the present invention.

FIG. 1 depicts an illustrative embodiment of a micro-machined multi-sensor 100, in accordance with the present invention. In the illustrated embodiment, the multi-sensor 100 comprises a pair of accelerometers 102 and 104. The accelerometers 102 and 104 include masses 103 and 105, respectively, each of which is substantially circular. It should be understood that the masses 103 and 105 may alternatively be substantially square, hexagonal, octagonal, or any other suitable geometric shape. The circular masses 103 and 105 are anchored to and suspended over a substrate 101 by a plurality of flexures (not shown). The multi-sensor 100 further comprises a fork member 106 configured to couple the two circular masses 103 and 105 to allow relative antiphase movement and to resist in phase movement of the masses. The pluralities of flexures anchoring the circular masses 103 and 105 and suspending them over the substrate 101 are configured to constrain the masses to move substantially only in a rotational manner relative to the substrate 101.

For example, the substrate 101 may comprise a silicon substrate, or any other suitable type of substrate. Further, the substrate 101 may be subjected to any suitable micro-machining process such as surface micro-machining to form the Micro Electro Mechanical System (MEMS) multi-sensor device. It is noted that the circular masses 103 and 105 and the coupling fork 106 of the MEMS multi-sensor 100 may be formed via any suitable process in the art.

As shown in FIG. 1, the multi-sensor 100 has two associated mutually orthogonal rotation-sensing axes X and Y in the plane of the substrate 101, and one associated acceleration-sensing axis Z perpendicular to the rotation axes X and Y (i.e., perpendicular to the substrate 101). The multi-sensor 100 is configured to provide two indications of angular rate sensing relative to the rotation axes X and Y, and one indication of acceleration sensing relative to the acceleration axis Z. Further, each of the circular masses 103 and 105 has lateral and longitudinal axes of symmetry (not labeled) and a rotation axis (i.e., rotation axes 142 and 144, see FIG. 1) perpendicular to the lateral and longitudinal axes associated therewith.

The multi-sensor 100 also includes acceleration sense electrode structures 108–115 disposed along the longitudinal and lateral axes of the respective circular masses 103 and 105. Specifically, the acceleration sense electrode structures 108–109 and 112–113 are diametrically opposed to each other along the longitudinal and lateral axes, respectively, of the circular mass 103, and the acceleration sense electrode structures 110–111 and 114–115 are diametrically opposed to each other along the longitudinal and lateral axes, respectively, of the circular mass 105. Each one of the acceleration sense electrode structures 108–115 includes a first electrode disposed on the surface of the respective circular mass, and a second electrode disposed on the surface of the substrate 101 opposite the first electrode, forming a differential capacitor having a capacitance value that increases/decreases based on the distance between the first and second electrodes. The multi-sensor 100 includes circuitry configured to sense changes in the capacitance values, and to provide electrically independent acceleration sense signals that include information pertaining to angular rate sensing and acceleration sensing relative to the rotation axes X,Y and the acceleration axis Z, respectively. For example, each of the first and second electrodes of the acceleration sense electrode structures 108–115 may be made from polycrystalline silicon ("polysilicon"), a diffused region, a metal, or any other suitable material.

Figure 2:
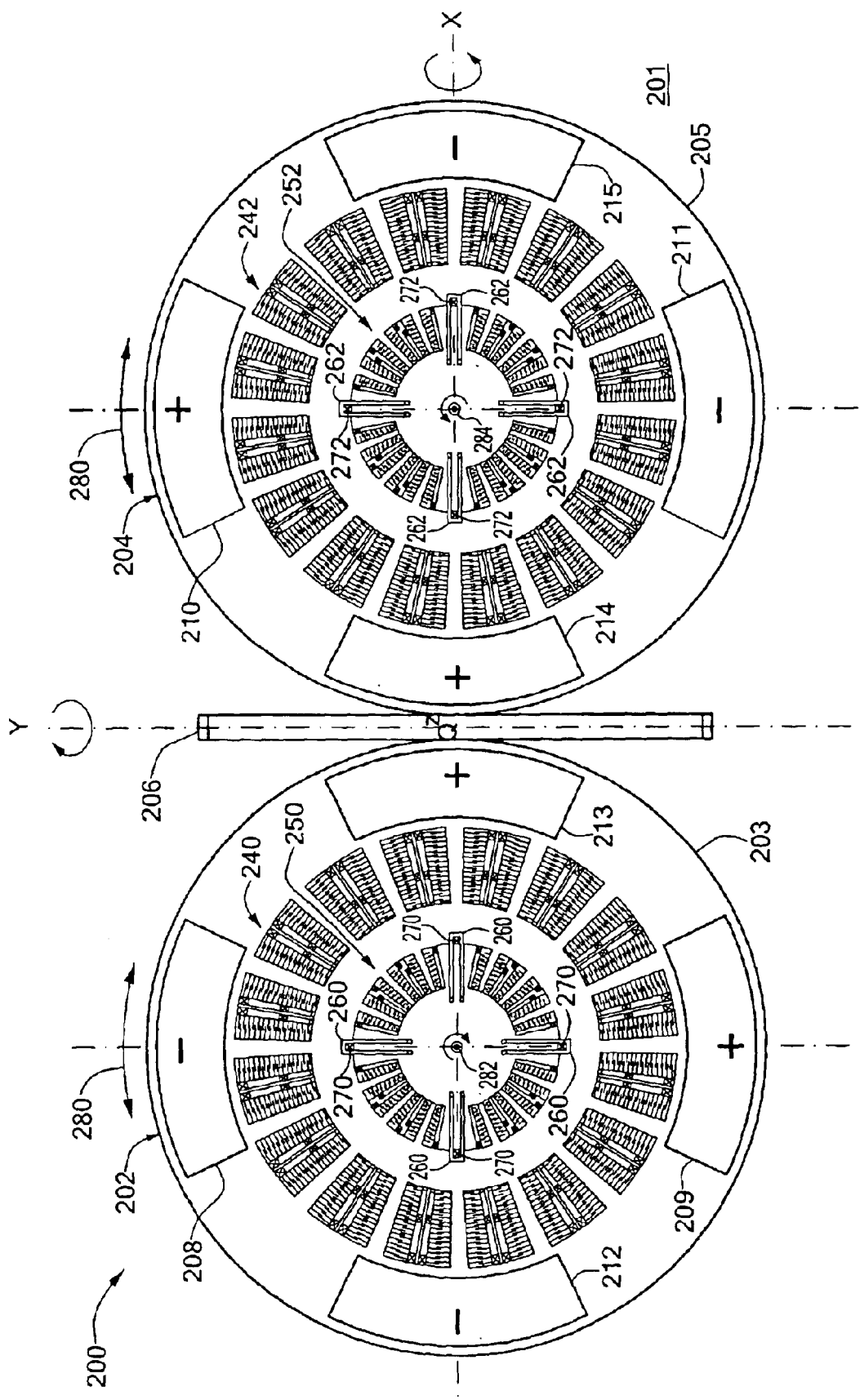
FIG. 2 is a detailed plan view of the micro-machined multi-sensor of FIG. 1.

FIG. 2 depicts a detailed plan view 200 of the micro-machined multi-sensor 100 (see FIG. 1). As shown in FIG. 2, the micro-machined multi-sensor 200 comprises a pair of accelerometers 202 and 204. The accelerometers 202 and 204 include substantially circular masses 203 and 205, respectively, which are anchored to and suspended over a substrate 201 such as a silicon substrate by pluralities of flexure structures. Specifically, each of the flexure structures anchoring and suspending the circular mass 203 includes an anchor 270 and a stress relief member 260, and each of the flexure structures anchoring and suspending the circular mass 205 includes an anchor 272 and a stress relief member 262. In the illustrated embodiment, each of the stress relief members 260 and 262 is folded in half with the center free so as to relieve stress. Because this configuration can cause some local asymmetry of restorative forces and moments, the folded members 260 and 262 are arranged in pairs to maintain balance (see FIG. 2).

The multi-sensor 200 further comprises a fork member 206, and acceleration sense electrode structures 208–215. The fork member 206 is configured to couple the two circular masses 203 and 205 to allow relative antiphase rotational movement and to resist in phase rotational movement of the masses, as known in the art. The acceleration sense electrode structures 208–215 are disposed along longitudinal and lateral axes of the respective circular masses 203 and 205.

Figure 3:
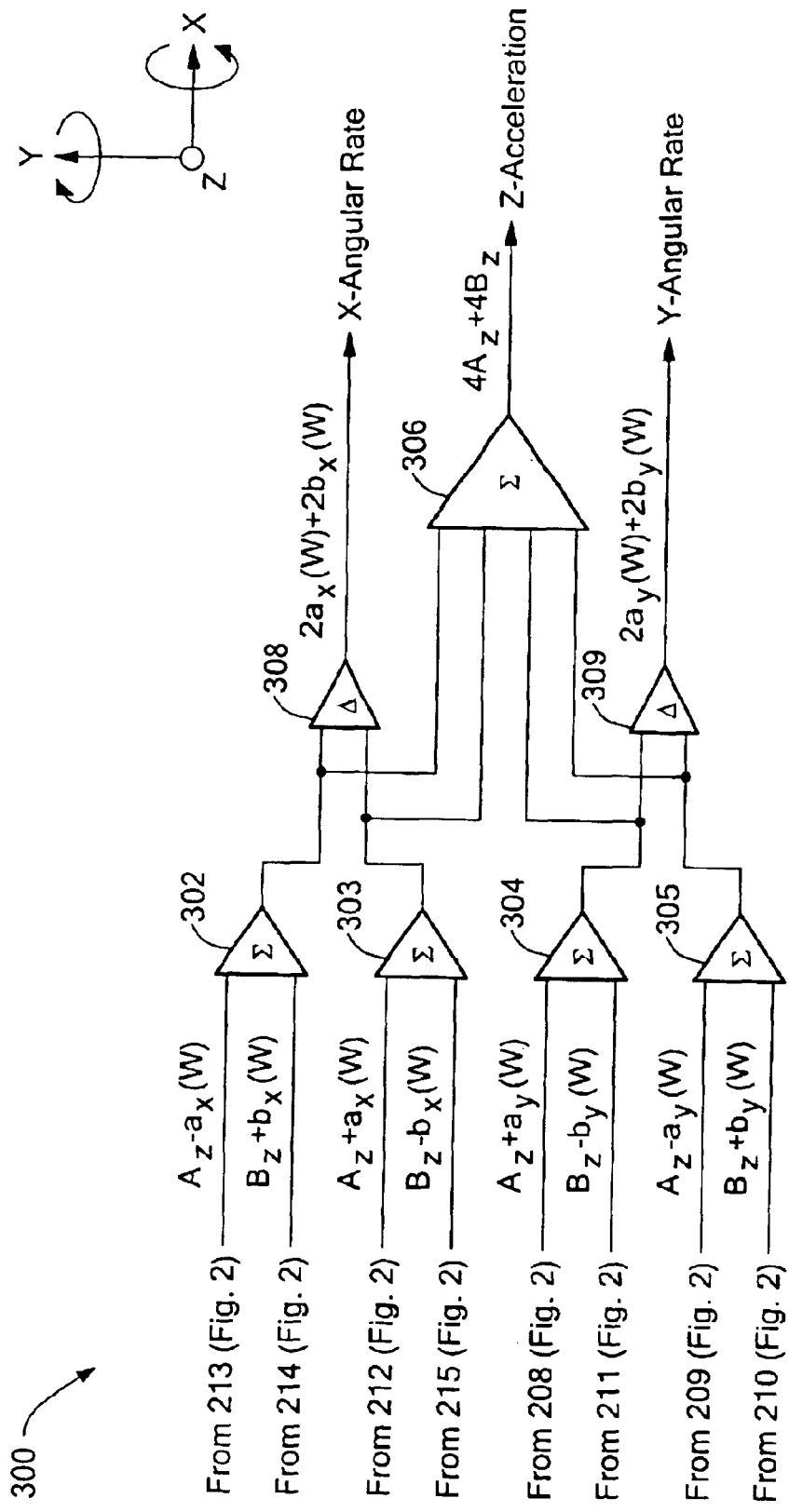
FIG. 3 is a schematic diagram of acceleration sense signal processing circuitry included in the micro-machined multi-sensor of FIG. 1.

It is noted that the circular masses 203 and 205, the fork member 206, and the acceleration sense electrode structures 208–215 are substantially equivalent to the circular masses 103 and 105, the fork member 106, and the acceleration sense electrode structures 108–115, respectively, of the multi-sensor 100 (see FIG. 1). Further, rotation-sensing axes X and Y and acceleration-sensing axis Z, as depicted in FIG. 3, correspond to the rotation-sensing axes X and Y and the acceleration-sensing axis Z described above with reference to FIG. 1.

As shown in FIG. 2, the multi-sensor 200 includes a plurality of drive electrode structures 240 and 242 anchored to the substrate 201, and configured for rotationally vibrating the circular masses 203 and 205 in antiphase, i.e., alternately rotating one mass clockwise/counterclockwise about its rotation axis while the other mass simultaneously rotates about its rotation axis in the opposite direction by substantially the same amount. Specifically, the drive electrode structures 240 are employed for rotationally vibrating the circular mass 203 about the rotation axis 282, and the drive electrode structures 242 are employed for rotationally vibrating the circular mass 205 about the rotation axis 284. In the presently disclosed embodiment, the drive electrode structures 240 and 242 are disposed along radial axes of the circular masses 203 and 205, respectively. Further, each of the drive electrode structures 240 and 242 includes a plurality of electrodes ("fingers") interdigitated with a corresponding plurality of fingers extending from at least one radial edge of the circular mass 203 and 205, respectively. The drive electrode structures 240 and 242 are coupled to a signal source (not shown) for generating drive signals operative to rotationally vibrate the masses 203 and 205 in antiphase in an oscillating manner, as depicted by directional arrows 280.

The multi-sensor 200 further includes a plurality of velocity sense electrode structures 250 and 252 anchored to the substrate 201, and configured to sense the vibration velocity of the circular masses 203 and 205, respectively. In the presently disclosed embodiment, the velocity sense electrode structures 250 and 252 are disposed along radial axes of the circular masses 203 and 205, respectively. Further, the velocity sense electrode structures 250 and 252 include pluralities of fingers interdigitated with corresponding pluralities of fingers extending from radial edges of the circular masses 203 and 205, respectively. The interdigitated fingers of the velocity sense electrode structures 250 and 252 form differential capacitors having capacitance values that increase/decrease based on whether the circular masses 203 and 205 rotate in a clockwise or counterclockwise manner. The multi-sensor 200 includes circuitry (not shown) configured to sense these changes in capacitance values, and to provide velocity sense signals indicative of the vibration velocity of the circular masses 203 and 205 based on the changing capacitance values.

Those of ordinary skill in the art will appreciate that as the circular masses 203 and 205 vibrate about the rotation axes 282 and 284, respectively, while the multi-sensor 200 rotates about a radial axis (not labeled) of the masses 203 and 205, the masses 203 and 205 undergo Coriolis acceleration along the respective rotation axes 282 and 284. Further, because the circular masses 203 and 205 vibrate in antiphase, the Coriolis acceleration is imposed on the respective masses in opposite directions. As a result, apparent Coriolis forces are applied to the circular masses 203 and 205, deflecting the masses 203 and 205 in opposite directions relative to the substrate 201.

For example, "+" and "−" signs are employed in FIG. 2 to indicate the relative directions of deflection of the circular masses 203 and 205 due to the applied Coriolis forces. As shown in FIG. 2, the acceleration sense electrode structures 208–209 and 212–213 of the mass 203 are labeled −, +, −, and +, respectively, and the corresponding acceleration sense electrode structures 210–211 and 214–215 of the mass 205 are labeled with the opposite signs +, −, +, and −, respectively, to indicate that the applied Coriolis forces deflect these corresponding regions of the masses 203 and 205 in opposite directions relative to the substrate 201.

It is noted that the acceleration sense electrode structures 208–209 along the longitudinal axis and the acceleration sense electrode structures 212–213 along the lateral axis of the circular mass 203 are labeled with the opposite signs −and +, respectively. Similarly, the acceleration sense electrode structures 210–211 along the longitudinal axis and the acceleration sense electrode structures 214–215 along the lateral axis of the circular mass 205 are labeled with the opposite signs +and −, respectively. This is because, in the presently disclosed embodiment, the circular masses 203 and 205 are rigid structures configured to tilt relative to the substrate 201 in response to the applied Coriolis forces.

Moreover, because the applied Coriolis forces deflect the circular masses 203 and 205 in opposite directions, the responses of the masses 203 and 205 to Coriolis acceleration relative to the rotation axes X and Y are in antiphase, while the responses of the circular masses 203 and 205 to linear acceleration relative to the acceleration axis Z are in phase. Accordingly, the electrically independent sense signals provided via the acceleration sense electrode structures 208–215 can be added and/or subtracted to extract information corresponding to the linear acceleration (i.e., the acceleration sensing information) and to extract information corresponding to the Coriolis acceleration (i.e., the angular rate sensing information) from the sense signals.

FIG. 3 depicts an illustrative embodiment of acceleration sense signal processing circuitry 300, which is configured to extract the acceleration sensing information and the angular rate sensing information from the acceleration sense signals provided by the acceleration sense electrode structures 208–215 (see FIG. 2). For example, the signal processing circuitry 300 may be implemented on the same substrate as the multi-sensor 200. In the illustrated embodiment, the sense signal processing circuitry 300 includes a plurality of summing amplifiers 302–306 and a plurality of difference amplifiers 308–309, which add/subtract the accelerations sensed by the acceleration sense electrode structures 208–215 to extract the acceleration and angular rate sensing information.

Specifically, the acceleration sensed by the acceleration sense electrode structures 208–209 includes a linear component Az relative to the acceleration axis Z and a time-varying rotational component ay(w) relative to the rotation axis Y, and the acceleration sensed by the acceleration sense electrode structures 210–211 includes a linear component Bz relative to the acceleration axis Z and a time-varying rotational component by(w) relative to the rotation axis Y. It is noted that the rotational components ay(w) and by(w) vary at an angular vibrating frequency w and are proportional to the rate of rotation about a radial axis perpendicular to the vibration velocity vector. Because the vibration velocities of the masses 203 and 205 are opposed, the accelerations sensed by the acceleration sense electrode structures 208–209 are Az+ay(w) and Az−ay(w), respectively, and the accelerations sensed by the acceleration sense electrode structures 210–211 are Bz+by(w) and Bz−by(w), respectively. Similarly, the accelerations sensed by the acceleration sense electrode structures 212–213 are Az+ax(w) and Az−ax(w), respectively, and the accelerations sensed by the acceleration sense electrode structures 214–215 are Bz+bx(w) and Bz−bx(w), respectively.

As described above, the responses of the circular masses 203 and 205 (see FIG. 2) to Coriolis acceleration relative to the rotation axes X and Y are in antiphase, while the responses of the circular masses 203 and 205 to linear acceleration relative to the acceleration axis Z are in phase. Accordingly, the responses of the circular masses 203 and 205 to Coriolis acceleration relative to the rotation axes X and Y as represented by the accelerations ay(w) and −ay(w), by(w) and −by(w), ax(w) and −ax(w), and bx(w) and −bx(w) are in antiphase, while the responses of the masses 203 and 205 to linear acceleration relative to the acceleration axis Z as represented by the accelerations Az and Bz are in phase.

As shown in FIG. 3, signals representative of the accelerations Az−ax(w) and Bz+bx(w) sensed by the electrode structures 213–214, respectively, are applied to the summing amplifier 302, which is configured to add these accelerations and to provide the resulting sum to the difference amplifier 308. Similarly, signals representative of the accelerations Az+ax(w) and Bz−bx(w) sensed by the electrode structures 212 and 215, respectively, are applied to the summing amplifier 303, which is configured to add these accelerations and to provide the resulting sum to the difference amplifier 308. The amplifier 308 subtracts the respective signal sums provided thereto, and generates a signal 2ax(w)+2bx(w) indicative of angular rate sensing relative to the rotation axis X ("X-Angular Rate").

Further, signals representative of the accelerations Az+ay(w) and Bz−by(w) sensed by the electrode structures 208 and 211, respectively, are applied to the summing amplifier 304, which is configured to add these accelerations and to provide the resulting sum to the difference amplifier 309. Signals representative of the accelerations Az−ay(w) and Bz+by(w) sensed by the electrode structures 209–210, respectively, are applied to the summing amplifier 305, which is configured to add these accelerations and to provide the resulting sum to the difference amplifier 309. The amplifier 309 subtracts the respective signal sums provided thereto, and generates a signal 2ay(w)+2by(w) indicative of angular rate sensing relative to the rotation axis Y ("Y-Angular Rate"). Moreover, the summing amplifiers 302–305 provide their respective signal outputs to the summing amplifier 306, which generates a signal 4Az+4Bz indicative of acceleration sensing relative to the acceleration axis Z ("Z-Acceleration").

Figure 4:
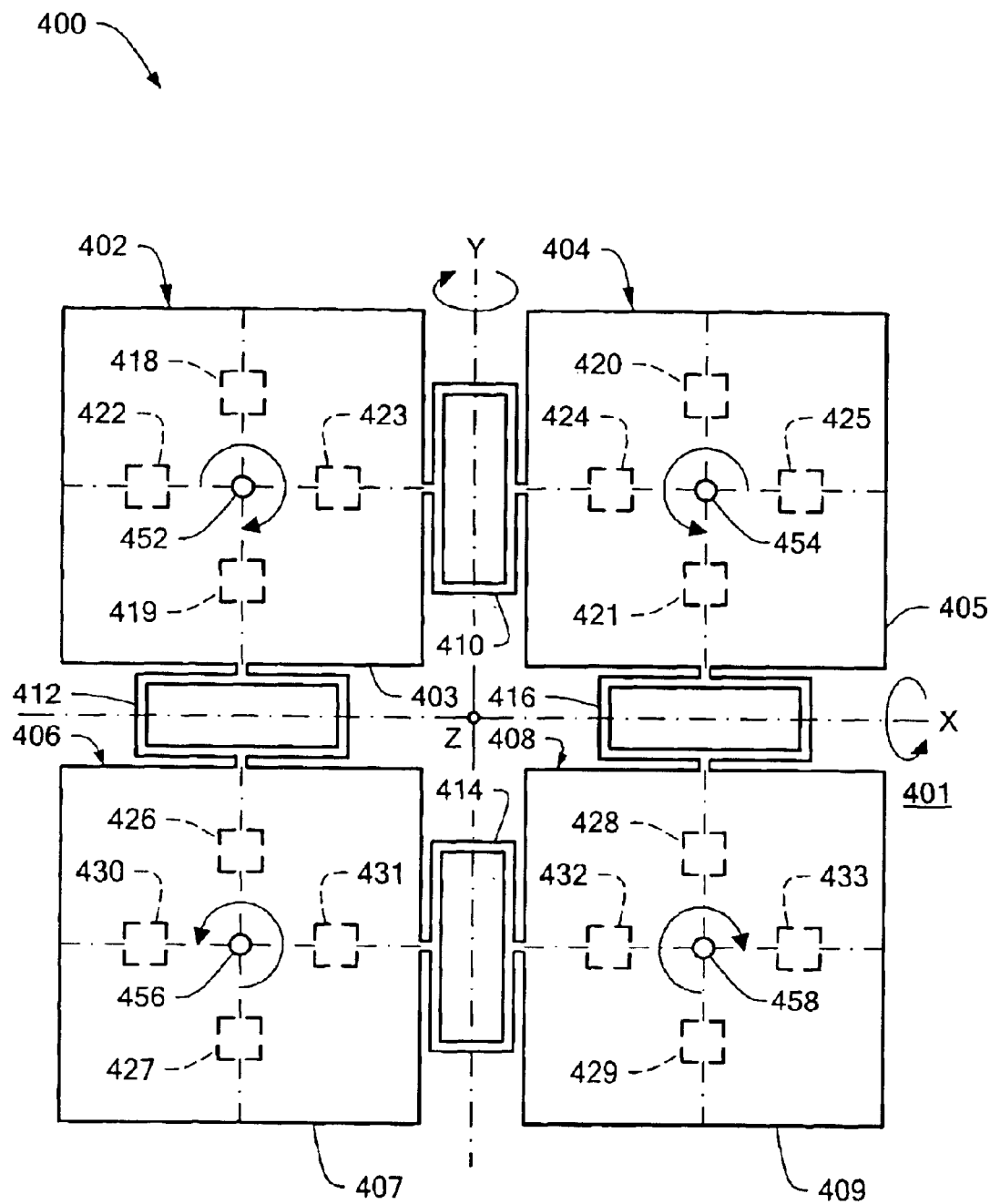
FIG. 4 is a simplified block diagram of an alternative embodiment of the micro-machined multi-sensor of FIG. 1.

FIG. 4 depicts a second illustrative embodiment of a micro-machined multi-sensor 400, in accordance with the present invention. In the illustrated embodiment, the multi-sensor 400 comprises two pairs of accelerometers 402 and 404, and 406 and 408, which are arranged to form a square. The accelerometers 402, 404, 406, and 408 include masses 403, 405, 407, and 409, respectively, each of which is substantially square-shaped. It should be understood, however, that the masses 403, 405, 407, and 409 may alternatively be substantially circular, hexagonal, octagonal, or any other suitable geometric shape.

The square masses 403, 405, 407, and 409 are suspended over and anchored to a substrate 401 by a plurality of flexures (not shown). The multi-sensor 400 further comprises a fork member 410 coupling the adjacent masses 403 and 405, a fork member 412 coupling the adjacent masses 403 and 407, a fork member 414 coupling the adjacent masses 407 and 409, and a fork member 416 coupling the adjacent masses 405 and 409. The fork members 410, 412, 414, and 416 are configured to couple the masses 403, 405, 407, and 409 to allow relative antiphase rotational movement and to resist in phase rotational movement of the adjacent masses about rotation axes 452, 454, 456, and 458.

Like the substrate 201 of the multi-sensor 200 (see FIG. 2), the substrate 401 of the multi-sensor 400 (see FIG. 4) may comprise a silicon substrate, or any other suitable type of substrate. Further, the substrate 401 may be subjected to any suitable micro-machining process such as surface micro-machining to form the MEMS multi-sensor device.

As shown in FIG. 4, the multi-sensor 400 has two associated mutually orthogonal rotation-sensing axes X and Y in the plane of the substrate 401, and one associated acceleration-sensing axis Z perpendicular to the rotations axes X and Y. Like the multi-sensor 200 (see FIG. 2), the multi-sensor 400 provides two indications of angular rate sensing relative to the rotation axes X and Y, and one indication of acceleration sensing relative to the acceleration axis Z.

The multi-sensor 400 also includes acceleration sense electrode structures 418–421, 426–429 and 422–425, 430–433 diametrically disposed along longitudinal and lateral axes, respectively, of the masses 403, 405, 407, and 409. Each one of the acceleration sense electrode structures 418–433 includes a first electrode disposed on the surface of a respective mass, and a second electrode disposed on the surface of the substrate 401 opposite the first electrode, to form a differential capacitor having a capacitance value that varies based on the distance between the first and second electrodes. Such capacitance values are employed to provide electrically independent acceleration sense signals including information pertaining to angular rate sensing and acceleration sensing relative to the rotation axes X,Y and the acceleration axis Z, respectively.

For example, the acceleration sense electrode structures 418–419, 420–421, 426–427, and 428–429 may be employed to provide indications of accelerations Az+ay(w) and Az−ay(w), Bz+by(w) and Bz−by(w), Cz+cy(w) and Cz−cy(w), and Dz+dy(w) and Dz−dy(w), respectively, in which Az, Bz, Cz, and Dz are linear acceleration components relative to acceleration axis Z, and ay(w), by(w), cy(w), and dy(w) are time-varying rotational acceleration components relative to the rotation axis Y. Further, the acceleration sense electrode structures 422–423, 430–431, 424–425, and 432–433 may be employed to provide indications of accelerations Az+ax(w) and Az−ax(w), Bz+bx(w) and Bz−bx(w), Cz+cx(w) and Cz−cx(w), and Dz+dx(w) and Dz−dx(w), respectively, in which ax(w), bx(w), cx(w), and dx(w) are time-varying rotational acceleration components relative to the rotation axis X. By suitably subtracting the respective accelerations, the linear components cancel out, leaving the rotational components including information pertaining to angular rate sensing relative to the rotation axes X and Y. Moreover, by suitably adding the respective accelerations, the rotational components cancel out, leaving the linear components including information pertaining to acceleration sensing relative to the acceleration axis Z.

Figure 5:
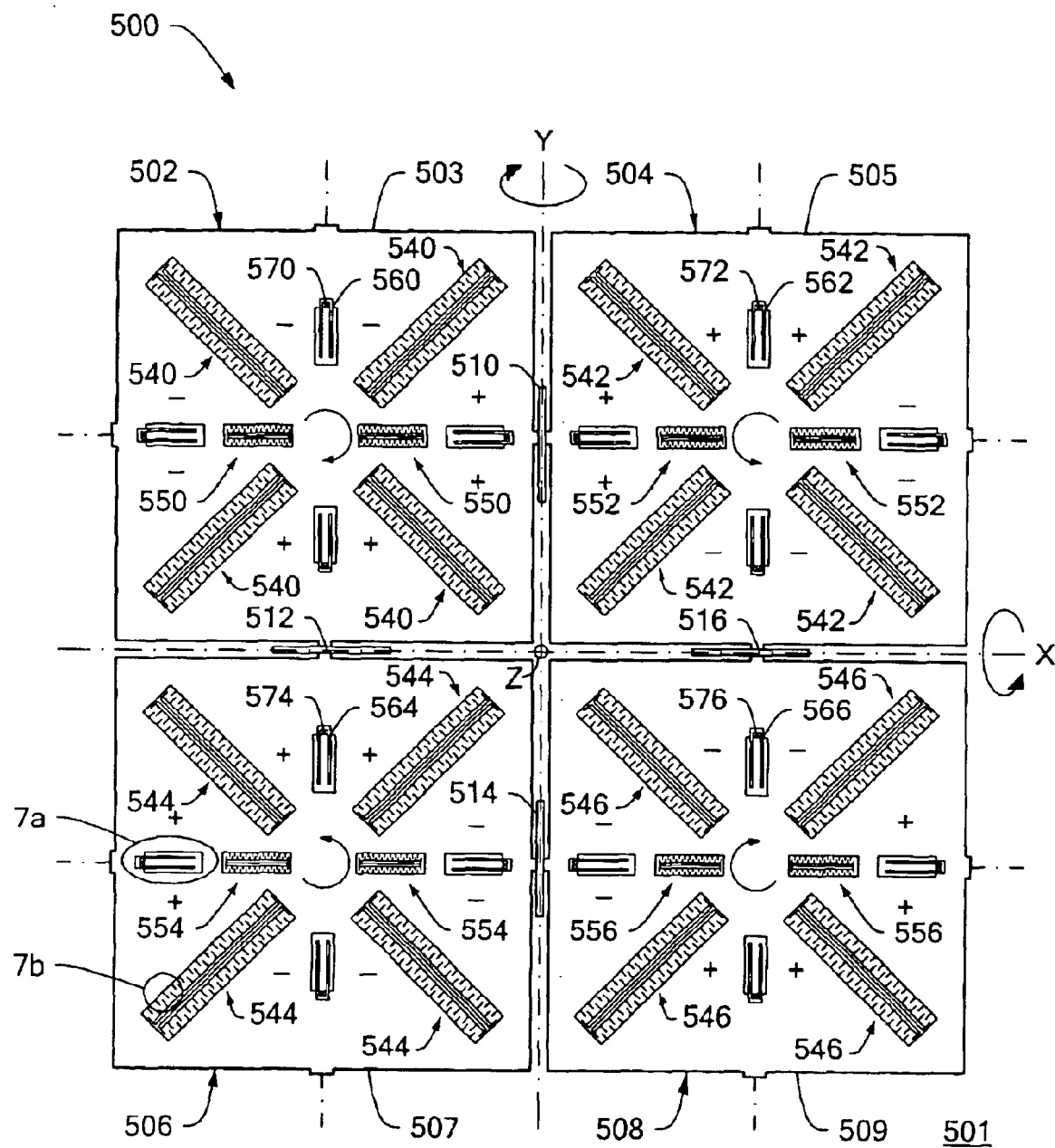
FIG. 5 is a detailed plan view of the micro-machined multi-sensor of FIG. 4.

FIG. 5 depicts a detailed plan view 500 of the micro-machined multi-sensor 400 (see FIG. 4). As shown in FIG. 5, the micro-machined multi-sensor 500 comprises two pairs of accelerometers 502, 504 and 506, 508. The accelerometers 502, 504, 506, and 508 include substantially square-shaped masses 503, 505, 507, and 509, respectively, anchored to and suspended over a substrate 501 by a plurality of flexures. Specifically, each of the flexure structures anchoring and suspending the mass 503 includes an anchor 570 and a stress relief member 560, each flexure anchoring/suspending the mass 505 includes an anchor 572 and a stress relief member 562, each flexure anchoring/suspending the mass 507 includes an anchor 574 and a stress relief member 564, and each flexure anchoring/suspending the mass 509 includes an anchor 576 and a stress relief member 566. It is noted that the anchor/stress relief member pairs are disposed along longitudinal and lateral axes of the respective masses 503, 505, 507, and 509. Like the stress relief members 260 and 262 (see FIG. 2), each of the stress relief members 560, 562, 564, and 566 is folded in half with the center free so as to relieve stress. Because this configuration can cause some local asymmetry of restorative forces and moments, the folded members 560, 562, 564, and 566 are arranged in pairs to maintain balance (see FIG. 5). The multi-sensor 500 further comprises fork members 510, 512, 514, and 516 configured to couple the adjacent masses to allow relative antiphase rotational movement, and to resist in phase rotational movement, of the masses, as known in the art.

It is noted that the masses 503, 505, 507, and 509, and the fork members 510, 512, 514, and 516, are substantially equivalent to the masses 403, 405, 407, and 409, and the fork members 410, 412, 414, and 416, respectively, of the multi-sensor 400 (see FIG. 4). Further, rotation-sensing axes X and Y and acceleration-sensing axis Z, as depicted in FIG. 5, correspond to the rotation-sensing axes X and Y and the acceleration-sensing axis Z described above with reference to FIG. 4.

The multi-sensor 500 (see FIG. 5) includes a plurality of drive electrode structures 540, 542, 544, and 546 anchored to the substrate 501, and configured for rotationally vibrating the masses 503, 505, 507, and 509, respectively, such that the adjacent masses vibrate in antiphase. Each of the drive electrode structures 540, 542, 544, and 546 includes a plurality of fingers disposed along a radial axis of the mass, and interdigitated with a corresponding plurality of fingers extending from at least one radial edge of the mass. In the preferred embodiment, the drive electrode structures 540, 542, 544, and 546 are diagonally disposed on the masses 503, 505, 507, and 509, respectively.

The multi-sensor 500 also includes a plurality of velocity sense electrode structures 550, 552, 554, and 556 anchored to the substrate 501, and configured to sense the vibration velocity of the masses 503, 505, 507, and 509, respectively. Like the drive electrode structures 540, 542, 544, and 546, each of the velocity sense electrode structures 550, 552, 554, and 556 includes a plurality of fingers disposed along a radial axis of the mass, and interdigitated with a corresponding plurality of fingers extending from at least one radial edge of the mass. In the illustrated embodiment, the velocity sense electrode structures 550, 552, 554, and 556 are disposed along the lateral axes of the masses 503, 505, 507, and 509, respectively. It is noted that "+" and "−" signs are employed in FIG. 5 to indicate the relative directions of deflection of the vibrating masses 503, 505, 507, and 509 due to Coriolis forces applied thereto, as the multi-sensor 500 rotates about a radial axis (not labeled) of the masses.

It should be appreciated that the accelerometers 502, 504, 506, and 508, and the fork members 510, 512, 514, and 516, are arranged in mirror image fashion on each side of a lateral axis of symmetry and on each side of a longitudinal axis of symmetry of the multi-sensor 500. Accordingly, the multi-sensor 500 can be symmetrically centered on a die (not shown) to reduce adverse effects of die surface area distortions and gradients on the performance of the multi-sensor 500.

Figure 6:
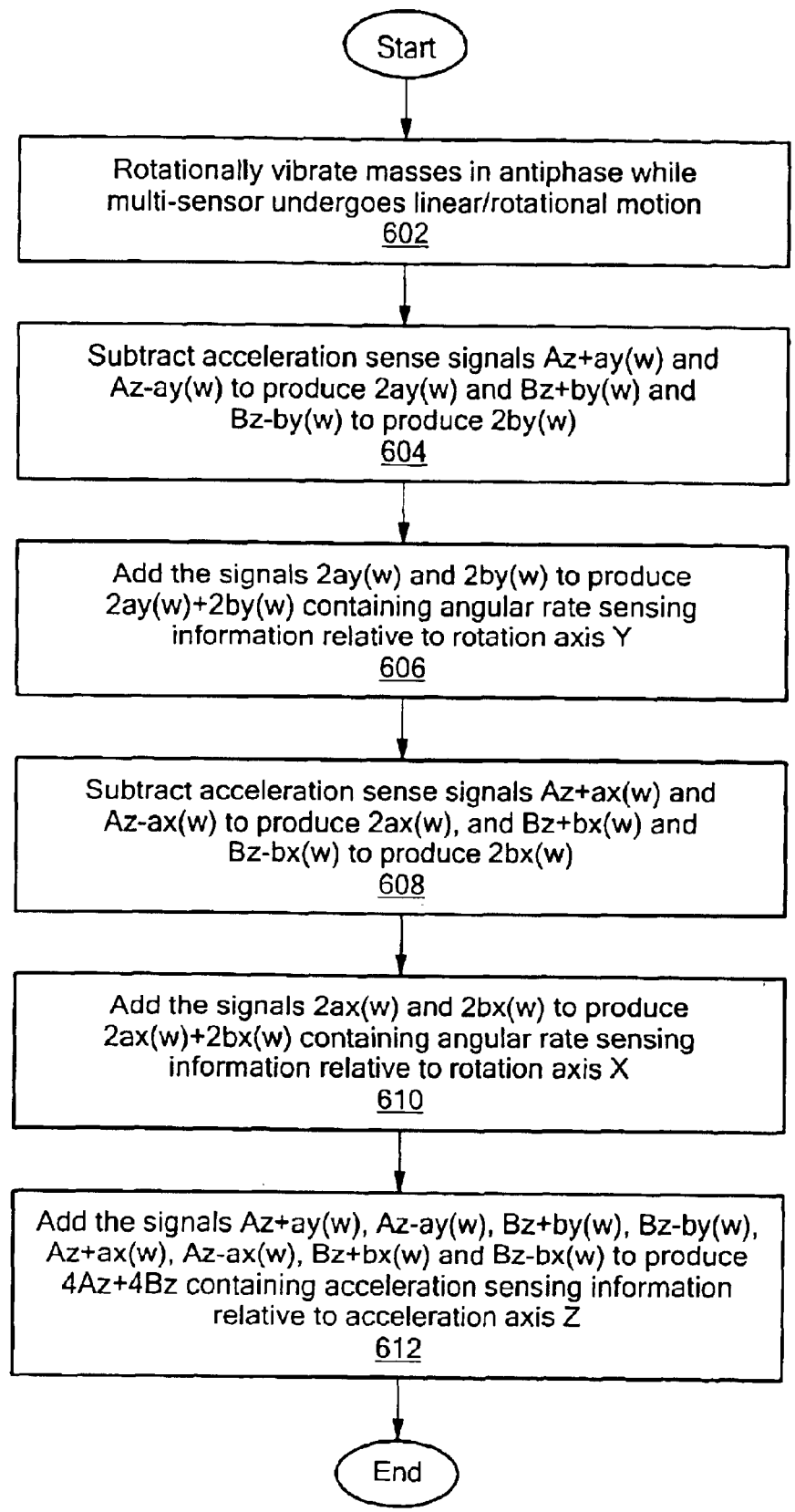
FIG. 6 is a flow diagram of a method of operating the micro-machined multi-sensor of FIG. 2.

A method of operating the presently disclosed micro-machined multi-sensor such as the multi-sensor 200 (see FIG. 2) is illustrated by reference to FIG. 6. As depicted in step 602, the masses 203 and 205 are rotationally vibrated in antiphase about the rotation axes 282 and 284, respectively, while the multi-sensor 200 undergoes linear/rotational motion. It is understood that the axes of rotation X and Y are in the plane of the multi-sensor substrate 201, and the axis of linear acceleration Z is perpendicular to the rotation axes. Next, the acceleration sense signals Az+ay(w) and Az−ay(w) generated by the acceleration sense electrode structures 208–209, respectively, are subtracted, as depicted in step 604, to produce the difference of the sense signals 2ay(w), and the acceleration sense signals Bz+by(w) and Bz−by(w) generated by the acceleration sense electrode structures 210–211, respectively, are subtracted, as also depicted in step 604, to produce the difference of the sense signals 2by(w). The signals 2ay(w) and 2by(w) are then added, as depicted in step 606, to produce the sum of the signals 2ay(w)+2by(w), which contains information pertaining to angular rate sensing relative to the rotation axis Y (Y-Rotation). Next, the acceleration sense signals Az+ax(w) and Az−ax(w) generated by the acceleration sense electrode structures 212–213, respectively, are subtracted, as depicted in step 608, to produce the difference of the sense signals 2ax(w), and the acceleration sense signals Bz+bx(w) and Bz−bx(w) generated by the acceleration sense electrode structures 214–215, respectively, are subtracted, as also depicted in step 608, to produce the difference of the sense signals 2bx(w). The signals 2ax(w) and 2bx(w) are then added, as depicted in step 610, to produce the sum of the signals 2ax(w)+2bx(w), which contains information pertaining to angular rate sensing relative to the rotation axis X (X-Rotation). Finally, the signals Az+ay(w), Az−ay(w), Bz+by(w), Bz−by(w), Az+ax(w), Az−ax(w), Bz+bx(w), and Bz−bx(w) are added, as depicted in step 612, to produce the sum 4Az+4Bz, which contains information pertaining to acceleration sensing relative to the acceleration axis Z (Z-Acceleration).

Figure 7A:
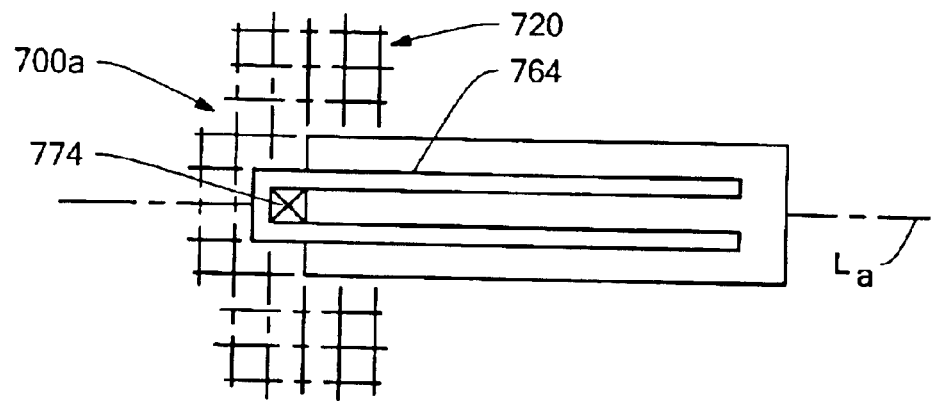
FIGS. 7a–7d are detailed views of functional components of the micro-machined multi-sensor of FIG. 4.
Figure 7B:
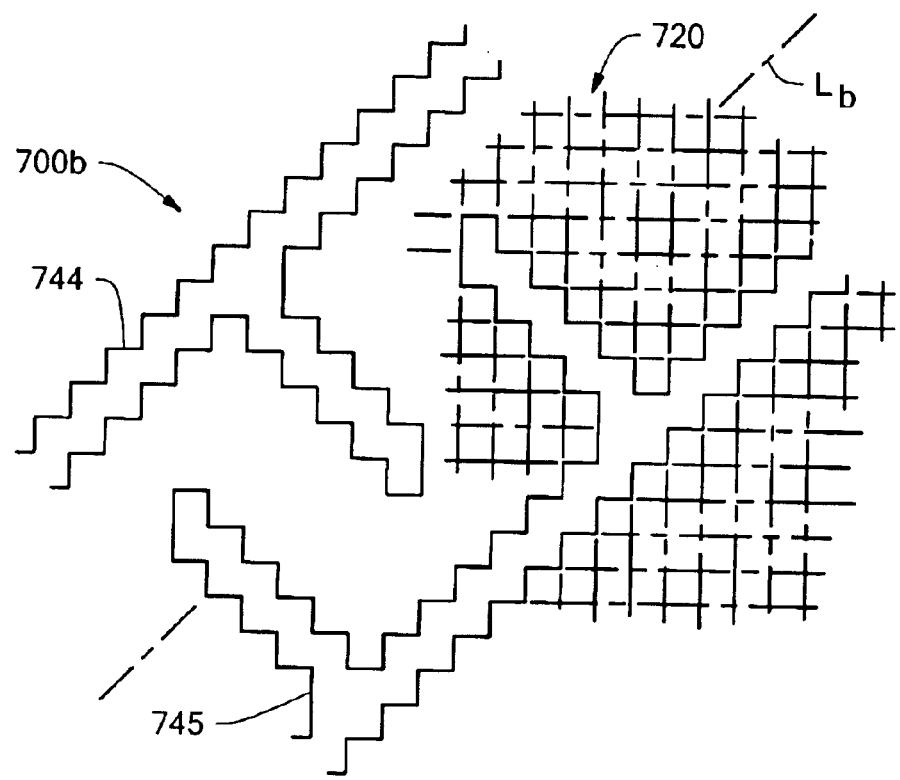

A method of fabricating the presently disclosed micro-machined multi-sensor is illustrated by reference to FIGS. 7a–7d, FIGS. 8a–8b, and FIG. 9. FIGS. 7a–7b depict detailed views of functional components of the micro-machined multi-sensor 500 (see FIG. 5). Specifically, FIG. 7a depicts a flexure 700a including an anchor 774 and a stress relief member 764. The flexure 700a is like the flexure including the anchor 574 and the stress relief member 564 shown in FIG. 5. Further, FIG. 7b depicts a drive electrode structure 700b including electrode portions 744–745. The drive electrode structure 700b is like the drive electrode structure 544 shown in FIG. 5. FIGS. 7a–7d also depict conceptual views of a rectilinear grid 720, which may be employed in the formation of a predetermined mask pattern for fabricating the sensor device. As shown in FIGS. 7a–7d, the rectilinear grid 720 has multiple horizontal and vertical spacings.

It should be appreciated that the presently disclosed micro-machined multi-sensor includes a number of functional components whose alignment on the substrate surface is critical to the optimal performance of the sensor device. For example, the alignment of particular flexures such as the flexure 700a (see FIG. 7a) is generally critical to optimal sensor performance. It should further be appreciated that the micro-machined multi-sensor includes a number of functional components whose alignment on the substrate surface is not critical to the optimal performance of the sensor device. For example, the alignment of the drive electrode structure 700b (see FIG. 7b) is generally not critical to optimal sensor performance. It is noted that the alignment of the velocity sense electrode structures 550, 552, 554, and 556 (see FIG. 5) is also generally not critical to the performance of the sensor device.

In the preferred embodiment, the functional components having critical alignments on the substrate surface are defined by the mask pattern so that respective critical axes associated therewith, e.g., a longitudinal axis $L_a$ (see FIG. 7a) of the flexure 700a, are substantially parallel to a horizontal or vertical axis of the mask. In other words, the critically aligned functional components are oriented parallel to or on the horizontal or vertical axis of the mask. For example, the flexure 700a is substantially parallel to horizontal lines (not numbered) forming the rectilinear grid 720, which in this example are parallel to the horizontal axis of the mask. It is noted that, in this example, vertical lines (not numbered) of the rectilinear grid 720 are parallel to the vertical axis of the mask. Moreover, the functional components having non-critical alignments on the substrate surface may be defined by the mask pattern so that respective non-critical axes associated therewith, e.g., a longitudinal axis $L_b$ (see FIG. 7b) of the drive electrode structure 700b, are not parallel to the horizontal and vertical axes of the mask. That is, the non-critical functional components may be oriented off the horizontal and vertical mask axes. For example, the drive electrode structure 700b is not parallel to the horizontal or vertical lines of the rectilinear grid 720.

As a result, the electrode portions 744–745 and interdigitated fingers (not numbered) extending from the electrode portions 744–745 have stepped outlines due to the horizontal and vertical spacings of the rectilinear grid 720 used to define the electrode In contrast, the outline of the flexure 700a is not stepped but instead consists of substantially straight lines, which facilitate the critical horizontal and vertical alignments of the component. Because the outline of the drive electrode structure 700b consists of stepped sections, such critical alignments of the component can be difficult to achieve.

Using the rectilinear grid 720 to form mask patterns for the presently disclosed multi-sensor device also results in a lack of accuracy in defining the widths of flexures. Specifically, the stiffness of a flexure generally varies as the cube of the flexure's width, and therefore relatively small errors in the width can have exaggerated effects on the flexure's stiffness. If the stiffness of flexures anchoring and suspending a mass over a substrate are not essentially identical, then the center of suspension of the rotating mass will not correspond to its center of inertia. As a result, instead of rotating smoothly, the mass will have a translational tendency, i.e., the mass will "wobble". This couples the driven mode of vibration directly into the sensing motion and produces a relatively large interfering signal. In a practical multi-sensor, it is desirable to keep such interference below about ten parts per million of the driven vibration. This interference is, even at such a relatively small level, comparable to the maximum Coriolis signal.

Because the width of each flexure in the presently disclosed multi-sensor is approximately equal to 2 microns, the width accuracy requirement can be a difficult constraint to satisfy. The mask making process typically involves translating working drawings onto a rectilinear grid such as the grid 720 (see FIGS. 7a–7d). As described above, if the flexures are not aligned with the grid, their respective outlines are made to conform to a stepped approximation on the grid. There will generally be several different approximations to any given angle, and existing algorithms for generating these approximations can be complex. As a result, there is at present no easy way of assuring that two identical flexures on the same structure will have identical widths if the flexures are not aligned with the rectilinear grid.

Figure 7C:
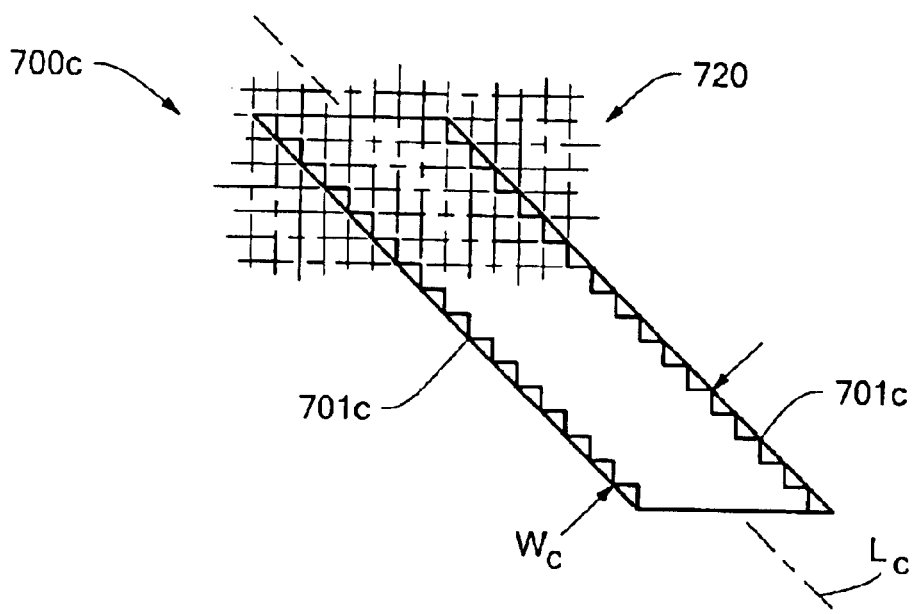
Figure 7D:
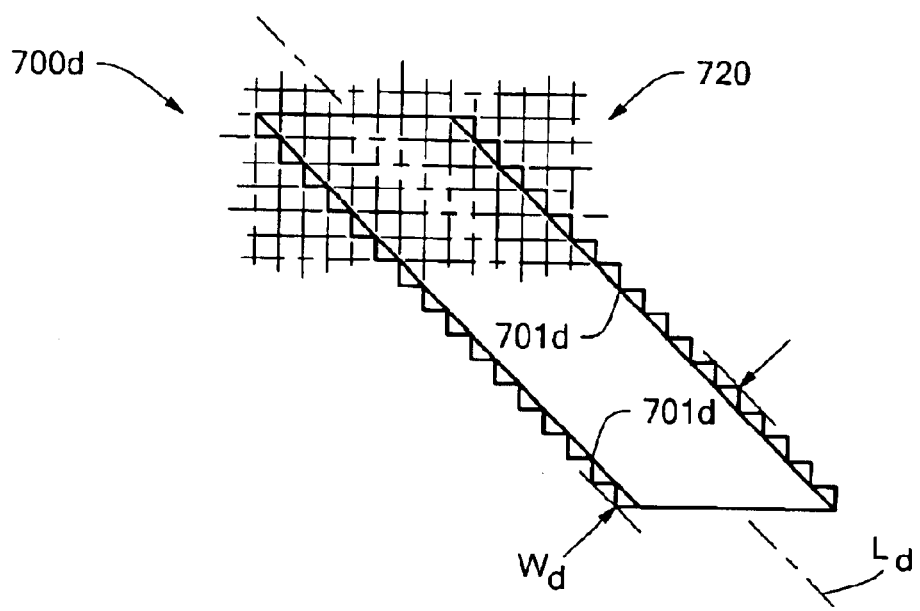

FIGS. 7c–7d depict two representative identical flexures 700c–700d, which may be included in the micro-machined multi-sensor 500 (see FIG. 5). As shown in FIGS. 7c–7d, the flexures 700c–700d are defined by the mask pattern so that their respective longitudinal axes $L_c$ and $L_d$ are oriented off the horizontal and vertical mask axes. Further, the flexures 700c–700d have alternating grid points corresponding to sloping line portions 701c–701d, respectively, that have about the same average deviation from the respective lines 701c–701d. The alternating grid points corresponding to the sloping lines 701c result in an effective flexure width $W_c$, and the alternating grid points corresponding to the sloping lines 701d result in an effective flexure width $W_d$. However, even though the flexures 700c–700d are identical, the effective width $W_d$ of the flexure 700d is greater than the effective width $W_c$ of the flexure 700c. Accordingly, in the event the flexures 700c–700d are critical to the proper operation of the multi-sensor, e.g., the flexures 700c–700d may have the critical function of anchoring/suspending a mass over the substrate, the flexures 700c–700d would preferably be defined by the mask pattern so that their respective axes $L_c$ and $L_d$ are oriented parallel to or on the horizontal or vertical axes of the mask like the flexure 700a (see FIG. 7a).

Figure 8A:
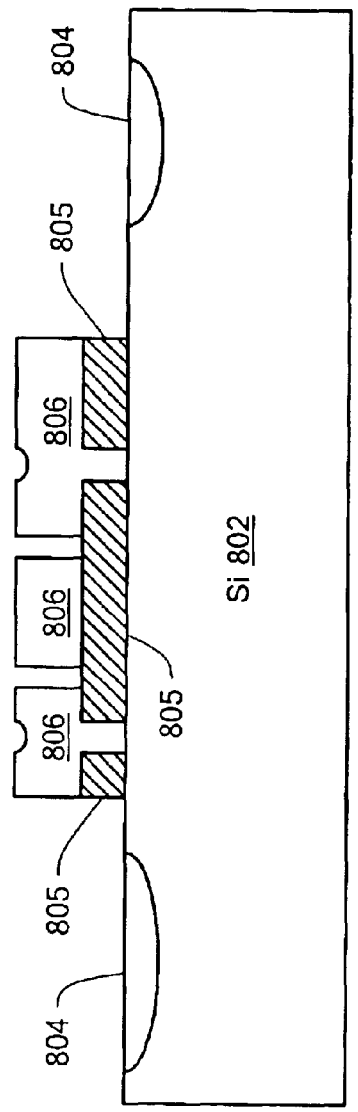
FIGS. 8a–8b are cross-sectional views of the micro-machined multi-sensor of FIG. 4 illustrating a method of fabricating the multi-sensor device.
Figure 8B:
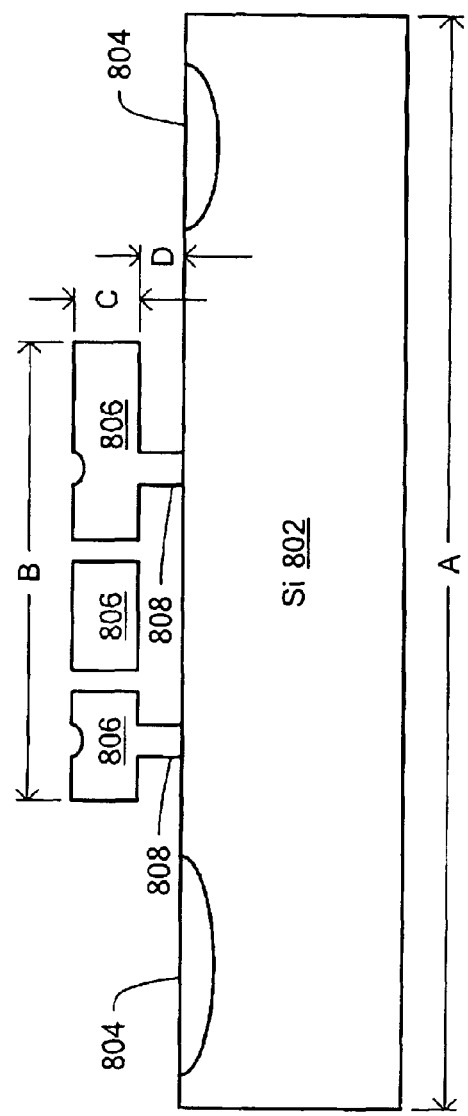

FIGS. 8a–8b are cross-sectional views 800a–800b of an illustrative micro-machined multi-sensor. It is appreciated that the micro-machined multi-sensor of FIGS. 8a–8b may be fabricated by surface micro-machining employing multiple layers of sacrificial and structural material. In the illustrated embodiment, the micro-machined multi-sensor 800a includes a substrate 802 made of silicon (Si) or any other suitable material. Deposited on the substrate surface are portions of a layer 805 of sacrificial material (e.g., silicon dioxide, $SiO_2$), which are removed at a final step of the fabrication process. After the sacrificial material is optionally etched, a layer 806 of structural material (e.g., polysilicon) is deposited on the sacrificial layer 805. It is noted that the structural layer 806 may also undergo etching. Further, electronic circuitry may be incorporated in one or more regions 804 near the structural layer 806 of the sensor device. As shown in FIG. 8b, the layer 806 of structural material is subsequently released by etching or otherwise removing the sacrificial layer 805, causing the structural layer 806 to be anchored to the substrate 802 by at least one pedestal 808. For example, the substrate 802 may have a width A of about 3 mm, the structural layer 706 may have an overall width B of about 1 mm and a thickness C of about 4 μm, and released regions of the structural layer 706 may be a distance D of about 2 μm from the substrate surface, as indicated in FIG. 8b.

Figure 9:
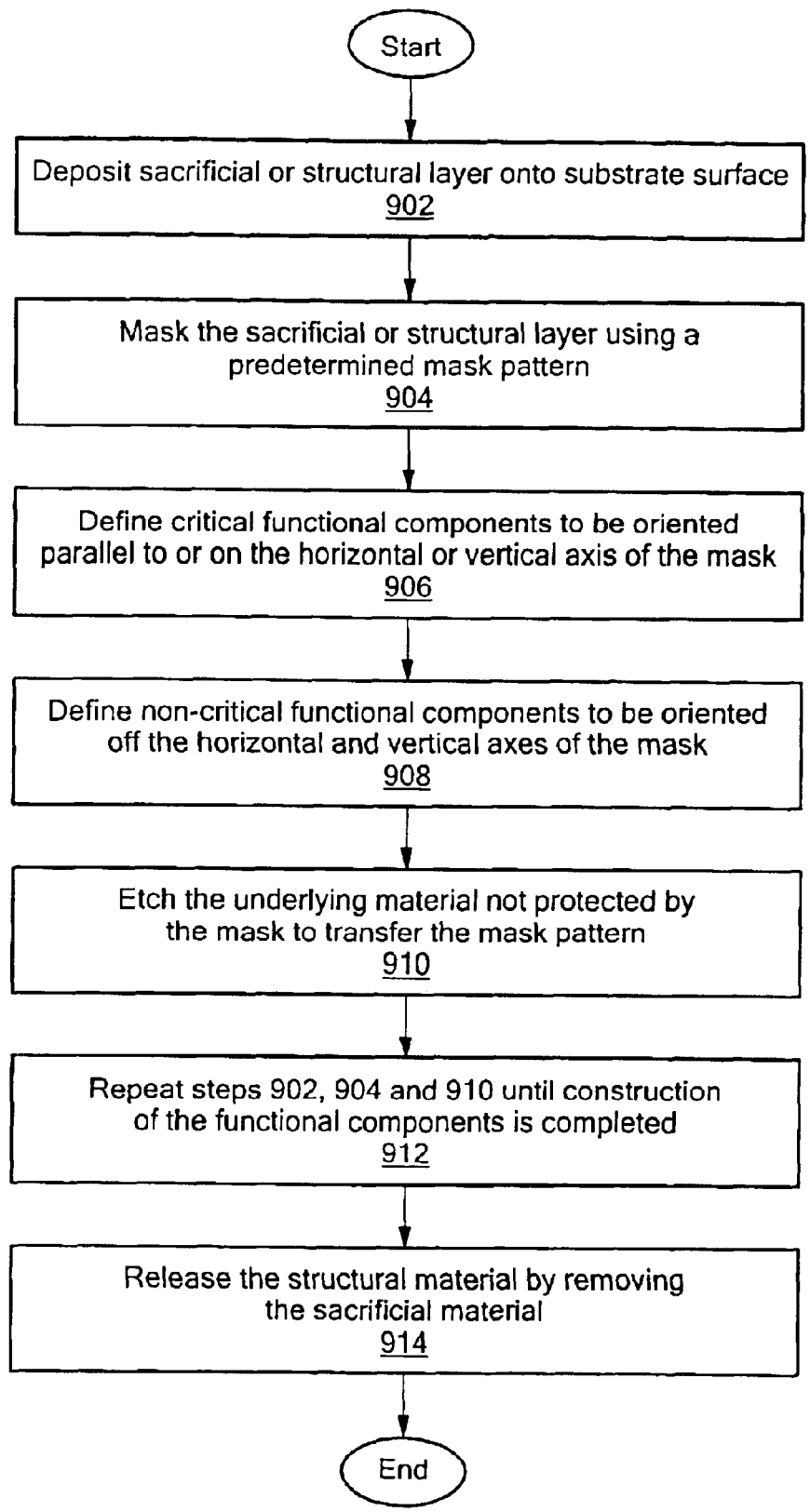
FIG. 9 is a flow diagram of the method of fabricating the micro-machined multi-sensor of FIG. 4.

The method of fabricating the presently disclosed micro-machined multi-sensor will be better understood with reference to FIG. 9. As depicted in step 902, a layer of sacrificial or structural material is deposited onto the surface of a substrate. Next, the layer of sacrificial or structural material is masked, as depicted in step 904, with a predetermined mask pattern. As described above, the mask pattern may be employed to define the functional components of the sensor device. In the event a functional component has an alignment and/or a physical dimension that are critical to the optimal performance of the sensor device, that component is defined by the mask pattern to be oriented parallel to or on the horizontal or vertical axis of the mask, as depicted in step 906. In the event the component alignment is not critical to sensor performance, that component may be defined by the mask pattern to be oriented off the horizontal and vertical axes of the mask, as depicted in step 908. Next, the underlying material not protected by the mask is suitably etched, as depicted in step 910, to transfer the mask pattern to that particular material layer. The depositing, masking, and etching steps 902, 904, and 910 are then repeated until the construction of the functional components of the micro-machined sensor device is completed. Finally, one or more portions of the structural material are released, as depicted in step 912, by etching or otherwise removing the underlying and/or surrounding sacrificial material.

It will further be appreciated by those of ordinary skill in the art that modifications to and variations of the above-described micro-machined device structures having on and off-axis orientations may be made without departing from the inventive concepts disclosed herein. Accordingly, the invention should not be viewed as limited except as by the scope and spirit of the appended claims.

What is claimed is:

1. A method of fabricating a micro-machined device on a substrate, the micro-machined device including at least one first component having a critical physical dimension or alignment on the substrate, and at least one non-critical second component, the method comprising the steps of:

depositing at least one layer onto a surface of the substrate;

masking the deposited layer using a predetermined mask pattern, the mask pattern having first and second mutually orthogonal axes associated therewith, the mask pattern being configured to define respective regions on the deposited layer corresponding to the first and second components of the device, the respective region corresponding to the at least one first component having an associated critical axis oriented substantially parallel to the first or second axis associated with the mask pattern, and the respective region corresponding to the at least one second component having an associated non-critical axis oriented off the first and second axes associated with the mask pattern; and etching the masked layer to transfer the mask pattern to the layer.

2. The method of claim 1 wherein the depositing step includes depositing the layer onto the substrate surface, the deposited layer comprising at least one layer of sacrificial or structural material.

3. The method of claim 2 further including the step of releasing the layer of structural material by removing the sacrificial material.

4. The method of claim 3 wherein the releasing step includes etching the layer of sacrificial material.

5. The method of claim 1 further including the step of repeating the depositing, masking, and etching steps until the fabrication of the first and second components is completed.

6. The method of claim 1 wherein the masking step further includes the step of forming the predetermined mask pattern using a rectilinear grid.

7. The method of claim 1 wherein the masking step includes masking the deposited layer using the predetermined mask pattern, wherein the critical axis associated with the first component is a longitudinal axis.

8. The method of claim 1 wherein the masking step includes masking the deposited layer using the predetermined mask pattern, wherein the non-critical axis associated with the second component is a longitudinal axis.

9. The method of claim 1 wherein the masking step includes masking the deposited layer using the predetermined mask pattern, wherein the critical axis associated with the first component is oriented substantially on the first or second axis associated with the mask pattern.

10. The method of claim 1 wherein the masking step includes masking the deposited layer using the predetermined mask pattern, wherein the first and second axes associated with the mask pattern correspond to horizontal and vertical axes, respectively, of the mask pattern.

11. The method of claim 10 wherein the masking step includes masking the deposited layer using the predetermined mask pattern, the horizontal and vertical axes of the mask pattern being substantially parallel to horizontal and vertical lines, respectively, of a rectilinear grid associated with the mask pattern.

12. The method of claim 11 wherein the masking step includes masking the deposited layer using the predetermined mask pattern, the respective regions corresponding to the first and second components being defined by the mask pattern with reference to the rectilinear grid.

* * * * *

UNITED STATES PATENT AND TRADEMARK OFFICE
CERTIFICATE OF CORRECTION

PATENT NO. : 6,767,758 B1  
DATED : July 27, 2004  
INVENTOR(S) : John A. Geen

It is certified that error appears in the above-identified patent and that said Letters Patent is hereby corrected as shown below:

Column 13,
Line 31, "electrode In" should read -- electrode structure. In --.

Signed and Sealed this

Seventh Day of June, 2005

JON W. DUDAS  
*Director of the United States Patent and Trademark Office*